US007602206B2

(12) United States Patent  (10) Patent No.: US 7,602,206 B2
Ball  (45) Date of Patent: Oct. 13, 2009

(54) METHOD OF FORMING A TRANSISTOR DIAGNOSTIC CIRCUIT

(75) Inventor: Alan R. Ball, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 33 days.

(21) Appl. No.: 11/759,772

(22) Filed: Jun. 7, 2007

(65) Prior Publication Data

US 2008/0030219 A1 Feb. 7, 2008

(51) Int. Cl.
*G01R 31/26* (2006.01)
(52) U.S. Cl. ........................................ 324/769; 324/765

(58) Field of Classification Search ........................ None
See application file for complete search history.

(56) References Cited

U.S. PATENT DOCUMENTS

| | | | | |
|---|---|---|---|---|
| 3,895,297 A | * | 7/1975 | Jarl | 324/765 |
| 3,979,672 A | * | 9/1976 | Arnoldi | 324/765 |
| 4,645,957 A | * | 2/1987 | Baliga | 327/430 |
| 5,486,772 A | * | 1/1996 | Hshieh et al. | 324/769 |
| 6,999,889 B2 | * | 2/2006 | Abe | 702/120 |

* cited by examiner

*Primary Examiner*—Paresh Patel
(74) *Attorney, Agent, or Firm*—Robert F. Hightower

(57) ABSTRACT

In one embodiment, a diagnostic circuit is used to test the on-resistance of a transistor.

8 Claims, 4 Drawing Sheets

| INPUT | | | | OUTPUT | | STATE |
|---|---|---|---|---|---|---|
| 81 | 82 | 83 | 84 | 79 | 80 | |
| 0 | 1 | 0 | X | 1 | 0 | REVERSE BIASED - NORMAL |
| 1 | 1 | 0 | X | 1 | 1 | REVERSE BIASED - OPEN |
| X | 0 | 1 | 1 | 0 | 0 | REVERSE BIASED - GOOD Rdson |
| X | 0 | 1 | 0 | 1 | 1 | FORWARD BIASED - OPEN |
| X | 0 | 0 | X | 0 | 1 | SHORTED |

METHOD OF FORMING A TRANSISTOR DIAGNOSTIC CIRCUIT

The present application is based on prior U.S. application Ser. No. 11/272,359 that was filed on Nov. 14, 2005 which is hereby incorporated by reference, and priority thereto for common subject matter is hereby claimed.

BACKGROUND OF THE INVENTION

The present invention relates, in general, to electronics, and more particularly, to methods of forming semiconductor devices and structure.

In the past, various different methods and circuits were used to assist in determining the operational status of circuits used to form redundant power supply systems. Multiple power rectifiers, such as ORing diodes or power MOS transistors controlled to operate as a diode, often were used to allow the multiple power sources to supply power to a load. In some cases, the rectifiers would fail and such failure sometimes was not detected until the rectifier was needed for operating the power system. Previous tests circuits used to determine the operational status of the rectifiers generally could only determine an open condition of the rectifier in the forward biased operating mode. Other failure states generally could not be evaluated while the rectifiers were in use within the power system.

Accordingly, it is desirable to have a test circuit that can determine the operational state of a rectifier during the operation of the rectifier, and that can determine failure states other than an open condition in the forward biased mode.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
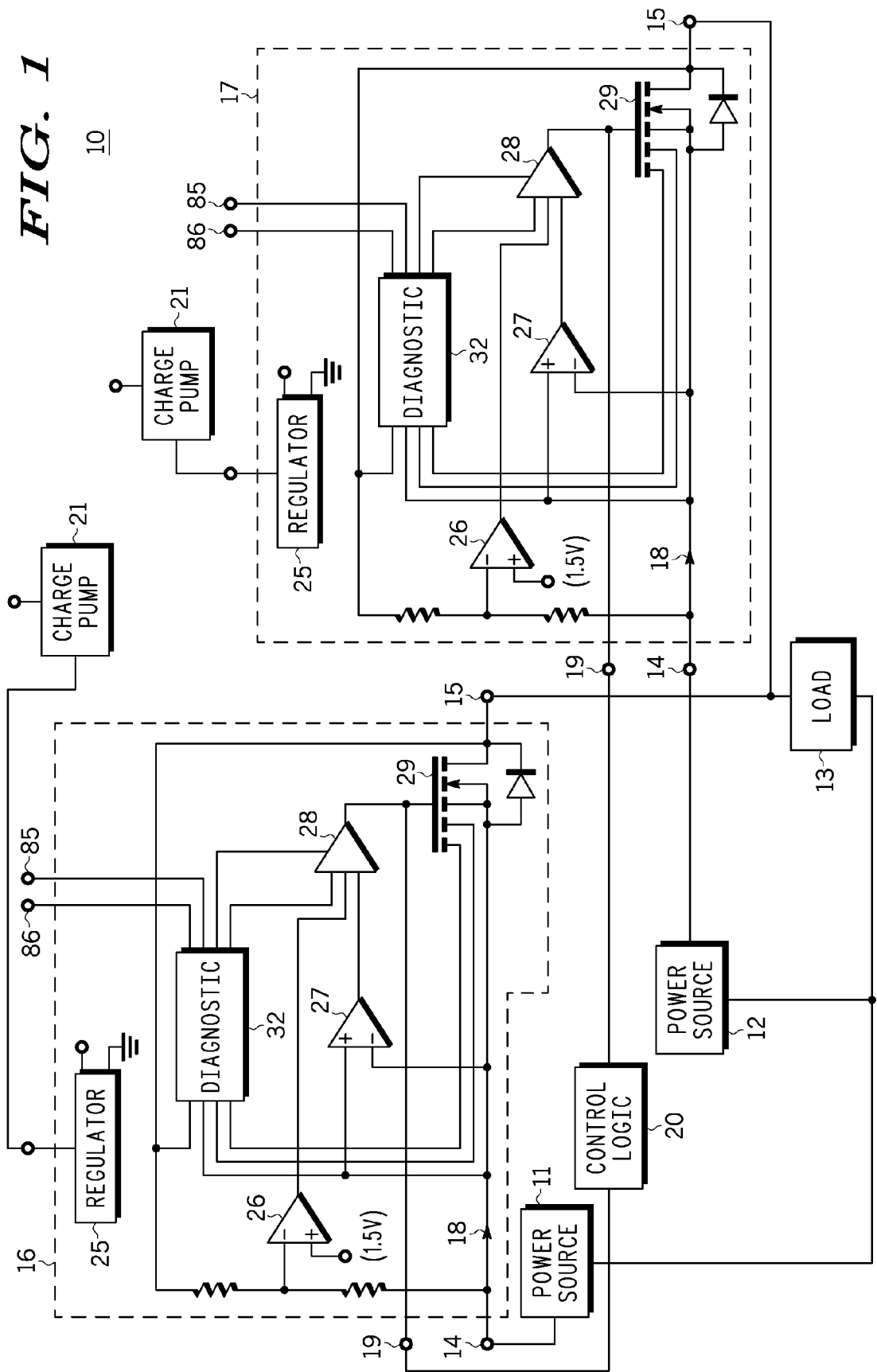
FIG. 1 schematically illustrates an exemplary embodiment of a portion of a power supply system that includes a diagnostic circuit in accordance with the present invention.

FIG. 1 schematically illustrates an exemplary embodiment of a portion of a power supply system 10 that manages the task of distributing power from multiple power sources, such as power sources 11 and 12, to a load 13. For the exemplary embodiment illustrated in FIG. 1, a power controller 16 receives power from power source 11 and supplies power to load 13, and a power controller 17 receives power from power source 12 and supplies power to load 13. In most embodiments, each of controllers 16 and 17 are substantially identical. Controllers 16 and 17 receive power from the power sources on a power input 14 and supply power to load 13 from a power output 15. A SenseFET type of power transistor 29 is connected between input 14 and output 15 in order to supply power to output 15. In some embodiments, transistor 29 may also be external to one of or both of controllers 16 and 17. Control logic 20 that is external to controllers 16 and 17 may be used to provide control logic that assists in operating transistors 29. An external charge pump circuit 21 typically is connected externally to each of controllers 16 and 17 to provide an operating power supply to controllers 16 and 17. The voltage supplied from circuit 21 usually is greater than the value of the voltage from sources 11 and 12 in order to facilitate operating controllers 16 and 17. Each of controllers 16 and 17 may also include an internal regulator 25, an over-voltage comparator 26, a polarity comparator 27, a diagnostic circuit or diagnostic 32, and a transistor driver 28. Internal regulator 25 generally uses the supplied voltage from circuit 21 to form an internal operating voltage for operating controllers 16 and 17. Polarity comparator 27 determines the polarity of the source voltage of transistor 29 and creates a drive signal that is utilized to enable transistor 29 if the polarity of the voltage across transistor 29 is a reverse bias voltage. Comparator 27 controls transistor 29 to operate as a rectifier. Comparator 26 detects an over-voltage and inhibits operating driver 28, thus transistor 29, if there is an over-voltage or under-voltage condition. In some embodiments, either of or both of controllers 16 and 17 may also include under-voltage protection. In such an embodiment, a power transistor may be connected externally to the controller and in series with transistor 29 in a back-to-back configuration. Such polarity comparators, over-voltage comparators, and internal regulators are well known to those skilled in the art.

As is well known in the art, the voltages supplied to load 13 by controllers 16 and 17 generally have slightly different values so that only one of controllers 16 and 17 is supplying a load current to load 13. In the event that one of controllers 16 or 17 fails or one of sources 11 or 12 fails, the other controller and source may begin supplying power to load 13. Although only two power sources and two controllers are illustrated, most systems use more that two of each. During the operation of controllers 16 and 17, it is desirable to test transistors 29 to determine if the transistors have failed or if the on-resistance (Rdson) of the transistor has increased. In one embodiment, controller 16, including transistor 29 and diagnostic 32, is formed on a semiconductor die that is assembled into a package for a semiconductor die.

Figure 2:
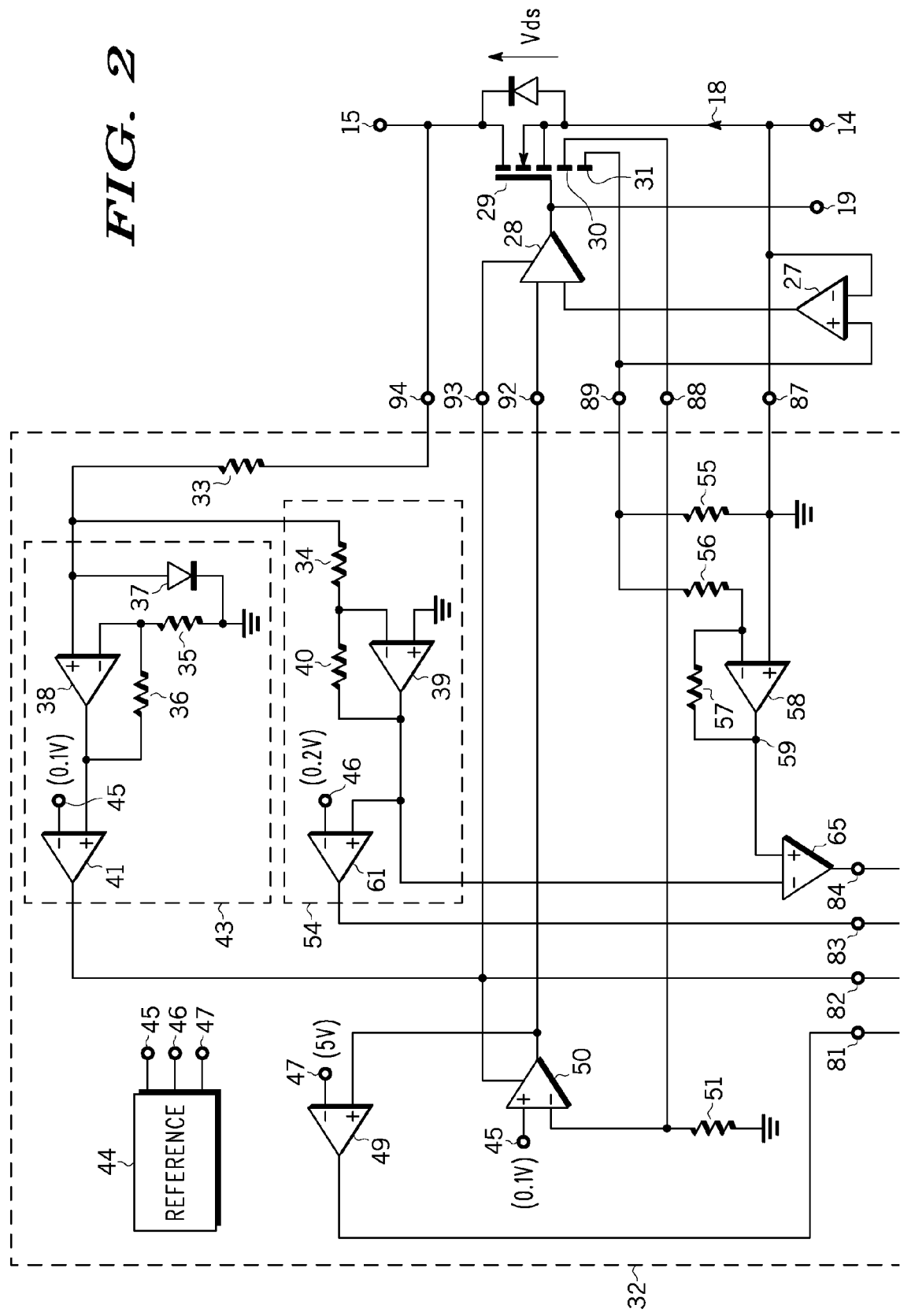
FIG. 2 schematically illustrates an embodiment of a first portion of a controller of the power supply system of FIG. 1 that includes an exemplary embodiment of a portion of a diagnostic circuit in accordance with the present invention.
Figure 3:
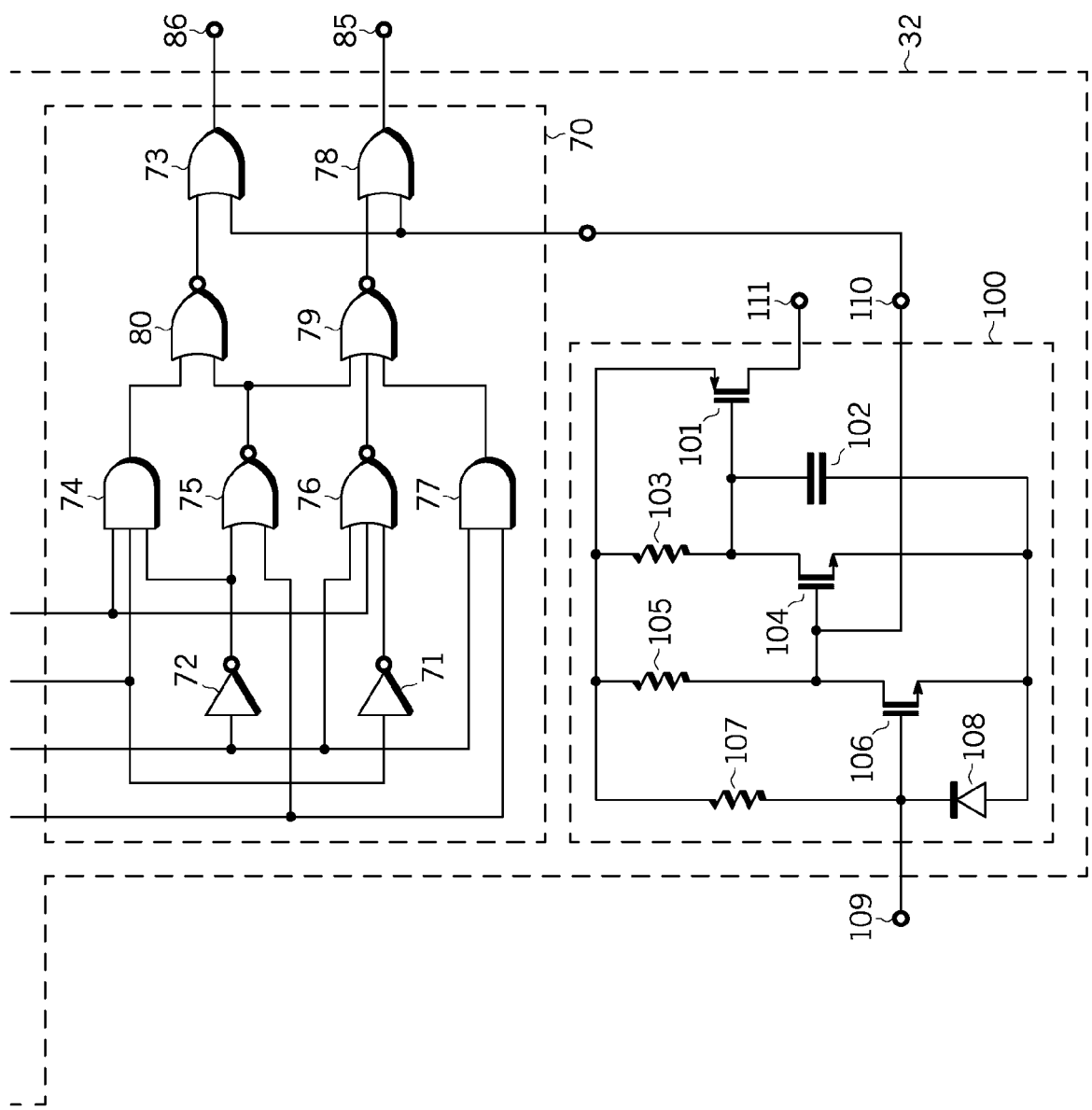
FIG. 3 schematically illustrates an embodiment of a second portion of the controller of FIG. 2 in accordance with the present invention.

FIG. 2 and FIG. 3 together schematically illustrate an exemplary embodiment of a portion of diagnostic 32 that was illustrated in FIG. 1.

Figures 4, 5:
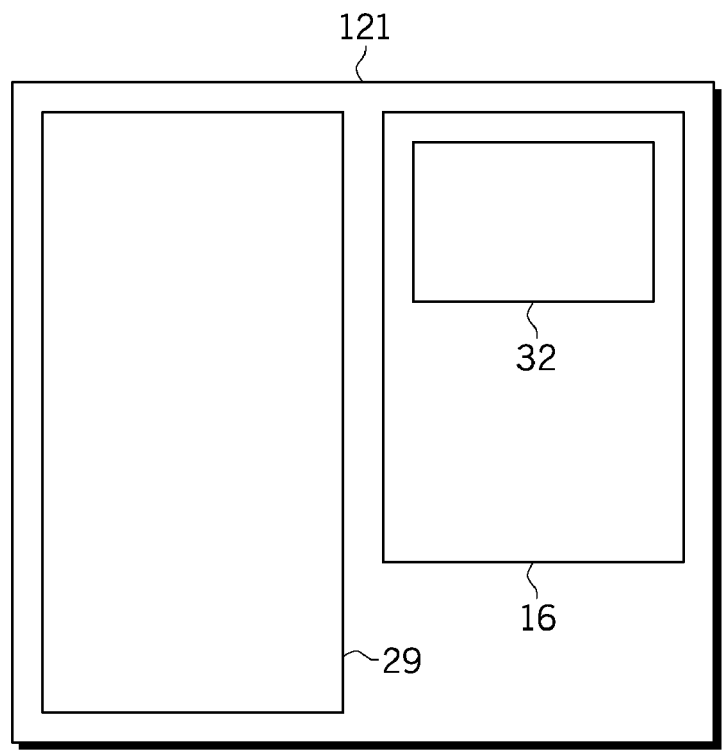
FIG. 4 is a table illustrating the state of some of the signals of the diagnostic circuit of FIG. 2 in accordance with the present invention.
FIG. 5 schematically illustrates an enlarged plan view of a semiconductor device that includes the diagnostic circuit of FIG. 2 and FIG. 3 in accordance with the present invention.

FIG. 4 is a table illustrating the state of some of the signals of diagnostic 32 during the operation thereof. This description has references to FIG. 2, FIG. 3, and FIG. 4. Driver 28, comparator 27, and transistor 29 are also illustrated to assist in the description of diagnostic 32. Diagnostic 32 is configured to detect a short circuit of transistor 29, to detect that transistor 29 is operating in either the forward or reverse biased operating mode, to detect an open state of transistor 29 in both the forward and reverse operating modes of transistor 29, and to measure the on-resistant (Rdson) of transistor 29 in the forward biased operating mode. Transistor 29 generally is a SenseFET type of power transistor. A SenseFET type of transistor usually is formed to include a main transistor portion and at least one sensing portion, or sense transistor. One example of a SENSEFET type of transistor is disclosed in U.S. Pat. No. 4,553,084 issued to Robert Wrathall on Nov. 12, 1985, which is hereby incorporated herein by reference. SENSEFET is a trademark of Motorola, Inc. of Schaumburg, Ill. In the preferred embodiment, transistor 29 includes two sense transistors 30 and 31 that each form a sense current representative of current 18. As will be seen further hereinafter, during operation in the forward biased mode a large current can flow through transistor 29, and sense transistor 31 is ratioed to the main transistor of transistor 29 to provide a sense current that facilitates easily determining the value of such a current. In the reverse biased mode, a smaller current may flow through transistor 29, and sense transistor 30 is ratioed to the main transistor of transistor 29 to provide a sense current that facilitates easily determining the value of such a current.

Diagnostic 32 includes a reverse biased detection circuit 43, a forward biased detection circuit 54, a test control circuit 100, a logic circuit 70, a comparator 49, a closed loop current drive circuit that includes an amplifier 50, and an on-resistance (Rdson) circuit that includes an amplifier 39, an amplifier 58, and a comparator 65. Diagnostic 32 also typically includes a reference generator or reference 44 that forms three reference voltages on outputs 45, 46, and 47 of reference 44. The reference voltages are utilized by various elements of diagnostic 32. Those skilled in the art will appreciate that the input voltage received by regulator 25 (FIG. 1) is referenced to an internal voltage return reference of diagnostic 32. In the exemplary embodiment illustrated in FIG. 2 and FIG. 3, the internal voltage return is referenced to the source of transistor 29. The term ground or the ground reference of signals within diagnostic 32 refers to the voltage potential of the internal ground reference that is substantially the voltage applied to the source of transistor 29.

Test control circuit 100 is utilized to activate or enable diagnostic 32 so that diagnostic 32 can test transistor 29. During the operation of system 10, diagnostic 32 normally is disabled and is selectively enabled to test transistor 29. This minimizes the power dissipation of diagnostic 32. A test signal is applied to a test input 109 of diagnostic 32 to test transistor 29. Circuit 100 usually includes a capacitor 102, transistors 101, 104, and 106, a diode 108, and resistors 103, 105, and 107. When the test signal on input 109 goes low, transistor 106 is disabled. Disabling transistor 106 allows resistor 105 to pull the gate of transistor 104 high which enables transistors 104 and 101. Transistor 101 supplies a bias current on a bias output 111 that operates diagnostic 32. The bias current from output 111 generally is connected to the bias supply transistor that supplies power to each of the elements of diagnostic 32. Thus, the elements of diagnostic do not receive power until input 109 is asserted by going low. In addition to enabling transistor 104, disabling transistor 106 also allows resistor 105 to pull an enable signal on output 110 of circuit 100 high. The high enable signal forces both outputs 85 and 86 of diagnostic 32 high. Causing outputs 85 and 86 to go high forms a known state while the logic of circuit 70 stabilizes. If both outputs 85 and 86 do not go high after the test input goes low, there is a failure of diagnostic 32. Enabling transistor 104 also discharges capacitor 102. After the test signal on input 109 goes high, transistor 106 is enabled which forces output 110 low thereby allowing the output of gates 79 and 80 to be coupled to respective outputs 85 and 86. Enabling transistor 106 also disables transistor 104 and allows capacitor 102 to begin charging. Capacitor 102 holds transistor 101 enabled to supply the bias power to diagnostic 32 until capacitor 102 has charge to a value sufficient to disable transistor 101. Disabling transistor 101 removes bias power from diagnostic 32 thereby disabling outputs 85 and 86 and preventing diagnostic 32 from testing transistor 29. Thus, the test signal going high allows diagnostic 32 to test transistor 29 for a period of time determined by the charging of capacitor 102. As can be seen, test control circuit 100 receives the test signal and for a period of time enables diagnostic 32 to test transistor 29 and provide control signals on outputs 85 and 86 that indicate the state of transistor 29 as illustrated by the table in FIG. 4.

Logic circuit 70 supplies logic signals which control the state of outputs 85 and 86 to indicate the state of transistor 29. If the voltages applied between input 14 and output 15 forward biases transistor 29 and transistor 29 is not in a shorted or open state, a forward bias current 18 flows from one of power source 11 or 12 through transistor 29 to load 13. As used herein, forward biased and reverse biased are based on the conduction mode of the body diode of transistor 29. Forward biased means that the body diode is forward biased and that current 18 can flow from the source to the drain of transistor 29 as illustrated by an arrow in FIG. 2. Reversed biased means that the body diode is reverse biased and that a negative current 18 can flow from the drain to the source of transistor 29. AS current 18 flows through transistor 29, there is also a forward biased drain-to-source voltage drop (Vds), illustrated by an arrow, from the drain to the source of transistor 29. If the voltages applied between input 14 and output 15 reverse bias transistor 29, and transistor 29 is not in a shorted or open condition, a negative current 18 flows from load 13 through transistor 29 to power source 11. The drain-to-source voltage drop (Vds) is negative for the reverse bias mode.

Assuming that the voltages applied between input 14 and output 15 reverse biases transistor 29 and that transistor 29 is not shorted, reverse bias detection circuit 43 detects the reverse bias condition. Reverse bias detection circuit 43 includes a diode 37, a comparator 41 and an amplifier 38 along with resistors 35 and 36. Amplifier 38 receives the drain voltage of transistor 29 on a non-inverting input through a resistor 33 and receives the source voltage on an inverting input through resistor 35. Amplifier 38 amplifies the difference between the drain and source voltages (Vds) of transistor 29 so that the signal on the output of amplifier 38 is a positive signal. The value of resistors 35 and 36 are selected to provide amplifier 38 a gain that is sufficient to ensure that for the reversed biased value of Vds, the output of amplifier 38 is greater than the reference voltage received by comparator 41. Thus, the output of comparator 41, and an input 82 of logic circuit 70, is high when transistor 29 is reversed biased. The reversed bias value of Vds usually is much larger than the forward biased Vds and generally is greater than one volt. In the preferred embodiment, the value of the reference voltage from output 45 of reference 44 is approximately 0.1 volts and the gain of amplifier 38 is approximately ten (10). For the reverse bias state of transistor 29, the output of forward bias detection circuit 54 is low. Forward bias detection circuit 54 includes a comparator 61, and an amplifier 39 along with resistors 34 and 40. Amplifier 39 receives the drain voltage of transistor 29 on an inverting input through resistors 33 and 34, and receives the source voltage on a non-inverting input. Amplifier 39 amplifies the difference between the drain and source voltages (Vds) so that the signal on the output of amplifier 39 is a positive signal that is representative of Vds. The value of resistors 34 and 40 are selected to provide amplifier 39 a gain that is sufficient to ensure that for the forward biased value of Vds, the output of amplifier 39 is greater than the reference voltage received by comparator 61. The reversed bias value of Vds forces the output of amplifier 39 low. The low from amplifier 39 forces the output of comparator 61 and an input 83 of circuit 70 low. As illustrated by the table in FIG. 4, a high on input 82 and a low on input 83 indicate that transistor 29 is operating in a reverse biased operating mode.

If transistor 29 is reverse biased, diagnostic 32 enables transistor 29 to cause a small reverse value of current 18 to flow through transistor 29 in order to test transistor 29. Amplifier 50 of the closed loop current drive circuit is used to provide a gate drive signal that slightly enables transistor 29 to form the reverse value of current 18. The output of comparator 41 is used as an enable signal to enable amplifier 50 responsively to the reverse bias mode detected by comparator 41. The output of comparator 41 also selectively switches driver 28 to use the input received from amplifier 50 instead of the input received from comparator 27. Since the output of comparator 41 is high, amplifier 50 is enabled and driver 28 uses the signal from amplifier 50 to drive transistor 29. The closed loop current drive circuit is configured to enable transistor 29 and regulate the value of current 18 to a small value that is just sufficient to determine the operating state of transistor 29 but low enough to not disturb the operation of system 10 (FIG. 1). For example, the negative value of current 18 may be regulated to a value of about one hundred to five hundred (100-500) milli-amps. Resistor 51 receives the resulting sense current from sense transistor 30 and forms a positive voltage across a resistor 51 that is received on the inverting input of amplifier 50. The non-inverting input of amplifier 50 receives a reference signal in order to regulate the value of current 18 to about one hundred milli-amps. In the preferred embodiment, the reference signal is a voltage of about one hundred milli-volts. The value of the drive signal from amplifier 50 should be around the value of the threshold voltage of transistor 29, typically around two to three volts, in normal reverse bias operation. Comparator 49 compares the value of the drive signal from amplifier 50 to a reference voltage. The value of the reference voltage applied to comparator 49 is selected to be greater than the value of the normal drive signal from amplifier 50 so that the output of comparator 49, and input 81 of circuit 70, is low for normal operation of transistor 29 in the reverse bias mode. As illustrated in the truth table of FIG. 4, a normal operating state of transistor 29 in the reverse bias operating mode is indicated by a low on input 81, a high on input 82 and a low on input 83. The state of an input 84 is undetermined and is a don't care condition for the logic of circuit 70. Note that the low from input 81 forces the output of gate 77 low. The high from input 82 forces the output of gate 76 low, and together with the low from input 81 forces the output of gate 75 high. The low from input 83 forces the output of gate 74 low. Thus, there is a high on an input of each of gates 79 and 80 to force the corresponding outputs high and low (see table in FIG. 4).

Amplifier 50 and comparator 49 are also used to detect an open state of transistor 29 in the reverse biased mode. If transistor 29 is open, there is no current through transistor 29, thus, no sense current from transistor 30, and resistor 51 pulls the inverting input of amplifier 50 is substantially ground. Therefore, amplifier 50 drives the output of amplifier 50 high, much higher than the threshold voltage of transistor 29. Comparator 49 receives the high from amplifier 50 which forces the output of comparator 49, and input 81 of circuit 70, high. In the preferred embodiment, the value of the reference voltage received on the non-inverting input of comparator 49 is set to be close to the maximum value of the output of amplifier 50 in order to detect the high voltage from amplifier 50 and the open state of transistor 29. Referring again to the truth table of FIG. 4, an open state of transistor 29 in the reverse bias operating mode is indicated by a high on inputs 81 and 82, and a low on input 83. The state of input 84 is undetermined and is a don't care condition for the logic of circuit 70. The high from input 81 forces the output of gate 75 low. The high from input 82 forces the output of gate 76 low, and together with the high from input 81 forces the output of gate 77 high. The low from input 83 forces the output of gate 74 low. Consequently, there is a high on an input of gate 79 but not on gate 80 and the outputs of both are high (see table in FIG. 4).

If the voltages applied between input 14 and output 15 forward biases transistor 29 and if transistor 29 is not open, forward biased detection circuit 54 detects the forward biased operating mode. In the forward bias mode, the output of forward bias detection circuit 54 is high and the output of reverse bias detection circuit 43 is low. Amplifier 39 amplifies the Vds of transistor 29. In the forward biased mode, Vds is usually less than about one volt and the output of amplifier 39 is greater than the value of the reference voltage received by comparator 61. Thus, the output of comparator 61, and input 83 of circuit 70, is high. Conversely, the forward bias forces the output of circuit 43 low. Because the drain of transistor 29 is at a lower voltage than the source, amplifier 38 is saturated and the output is substantially at ground. The low from amplifier 38 forces the output of comparator 41, and input 82 of circuit 70, low. Additionally, the low from comparator 41 disables amplifier 50 to prevent diagnostic 32 from driving transistor 29 and also switches driver 28 to use the output of comparator 27 to drive transistor 29. The value of the outputs of amplifier 50 and comparator 49 is undetermined when amplifier 50 is disabled, but circuit 70 ignores this state of comparator 49. As illustrated by the table in FIG. 4, a low on input 82 and a high on input 83 indicate that transistor 29 is operating in a forward biased operating mode.

If diagnostic 32 is activated when transistor 29 is operating in the forward biased operating mode and transistor 29 is not shorted, the Rdson circuit that includes comparator 65 and amplifiers 39 and 58 are used to test the value of the Rdson of transistor 29. Diagnostic 32 is configured to test the value of Rdson and detect if the Rdson value has increased past an upper Rdson limit. Generally, Rdson has a desired value that is used in designing a circuit that uses transistor 29. As is well known in the art, the value of Rdson may vary somewhat within a target range around the desired value and still remain usable for the circuit. As long as Rdson remains low enough to remain within the target range, the Rdson and transistor 29 are usually determined to be good or usable. If Rdson increases past an upper Rdson limit of the target range, then transistor 29 is not operating as efficiently as it is desired to operate and may have to be replaced. Diagnostic 32 tests the Rdson of transistor 29 and determines if the value of Rdson is within the desired target range or if the Rdson value has increased past the upper Rdson limit. In normal operation, as the value of Id increases the value of Vds also increases. Rdson usually is determined by dividing Vds by Id (Rdson=Vds/Id). Because it is difficult and expensive to implement a circuit that divides, the Rdson circuit uses the proportionality between Vds and Id to determine Rdson.

Amplifier 58 forms a signal on node 59 that is representative of Id, amplifier 39 forms a signal that is representative of Vds, and diagnostic 32 uses these signals to test Rdson. In the forward biased state, current 18 flowing through transistor 29 generates a sense current that flows from ground, through a resistor 55, and through transistor 31. The sense current forms a positive sense voltage across resistor 55 that is representative of Id. The non-inverting input of amplifier 58 is referenced to ground (the most positive side of the sense voltage) while the inverting input of amplifier 58 receives the negative side of the sense voltage through a resistor 56. Resistors 56 and 57 set the gain of amplifier 58 and assist in setting the value of the signal on node 59. Amplifier 39 receives the drain voltage of transistor 29 on the inverting input, through resistors 33 and 34, receives the source voltage on the non-inverting input, and responsively forms a signal on the output that is representative of Vds. In the preferred embodiment, the gain of amplifiers 39 and 58 are selected so that for a given value of Rdson within the target range the Vds representative signal from amplifier 39 is slightly lower than the Id representative signal on node 59. The ratio between these two signal values at that given value of Rdson assists in forming a constant differential or ratio between the value of the signal on node 59 and the signal from amplifier 39. The ratio forms an operating range of Rdson values that allows Rdson to vary during the operation of transistor 29. As long as the Rdson of transistor 29 remains within the operating range of values so that the ratio of the two representative signals (Vds/Id) remains less than one over the operating range of Vds and Id, then Id remains greater than Vds, the ratio remains less than one, and the output of comparator 65 will be high. If the value of Rdson increases past the upper Rdson limit established by the ratio, the ratio becomes greater than one and comparator 61 goes low to indicate a high Rdson value.

For example, assume that the Rdson of transistor 29 is approximately 0.1 ohm and that current 18 is approximately ten (10) amperes at a Vds of approximately one volt (1 V). If amplifier 39 has a gain of about 1.8 then the non-inverting input of comparator 65 receives about 1.8 V. If sense transistor 31 has a ratio of about 1000:1, the sense current is about ten (10) milli-amps. If resistor 55 is approximately one thousand (1000) ohms, the sense voltage across resistor 55 is about one hundred (100) milli-volts. If amplifier 58 has a gain of about twenty (20), the voltage at node 59 is approximately two (2) volts. The ratio for the 2.0 volt and 1.8 volt signals is less than one ((1.8/2.0)<1), thus the output of amplifier 39 is less than the output of amplifier 58 and the signals force the output of comparator 65 high. If Rdson increases during the operation of transistor 29, as long as the increase maintains the inequality of the ratio equation the output of amplifier 58 remains less than the output of amplifier 39 and comparator 65 remains high indicating that the Rdson remains less than the upper Rdson limit. As can be seen from the equation, as long as Vds and Id track each other, such as each changing by similar amounts, over the operating range of transistor 29, Rdson remains less than the upper Rdson limit. Referring again to FIG. 2 and FIG. 3, if Rdson is within the range established by the ratio of the outputs of amplifiers 58 and 39, less than the upper Rdson limit, and transistor 29 is forward biased, then input 83 of circuit 70 is high and input 82 is low indicating the forward biased mode, and input 84 is high indicating the good Rdson value or state. Input 81 is undetermined but is a don't care for the logic of circuit 70. Referring again to the truth table of FIG. 4, the low from input 82 forces the output of gates 75 and 77 low. The high from inputs 83 and 84 force the output of gate 74 high and gate 76 low thereby forcing the outputs of both gates 79 and 80 low (see table in FIG. 4).

If transistor 29 is in the forward biased mode and has an open circuit state, the output of comparator 65 will be low. If transistor 29 is open, there is no sense current flowing through resistor 55, thus the output of amplifier 58 will be low. The low on node 59 forces the output of comparator 65 low. If transistor 29 is open, the drain voltage is approximately at the voltage applied to load 13 and the source voltage is at a higher voltage, thus, Vds is positive and the output of amplifier 39 is within the normal operating range of amplifier 39 and is greater than the reference voltage received by comparator 61. The signal from amplifier 39 forces the output of comparator 61 and the corresponding input 83 of circuit 70 high. The output of amplifier 50 and the output of comparator 49 remain undetermined. Referring again to the truth table of FIG. 4, the low from input 82 forces the output of gates 75 and 77 low. The high from input 83 and the low from input 84 force the output of gate 74 low and gate 76 high thereby forcing the outputs of both gates 79 and 80 high (see table in FIG. 4).

If transistor 29 is shorted, the drain voltage is approximately equal to the source voltage regardless of the external voltages that are applied to input 14 and output 15. The approximately equal drain and source voltages force the output of amplifiers 38 and 39 to substantially a ground potential. The low from amplifiers 38 and 39 force the outputs of respective comparators 41 and 61, and corresponding inputs 82 and 83 of circuit 70, low. If transistor 29 is shorted there is no sense current from sense transistor 31, thus, no voltage across resistor 55. The state of the outputs of comparators 49 and 65 is undetermined and is a don't care condition for circuit 70. Note that the low from input 82 forces the output of gate 77 low, the output of inverter 72 high, and the output of gate 75 low, while the low from input 83 forces the output of gate 74 low, and the output of inverter 71 and gate 76 low. Thus all the inputs to gates 79 and 80 are low to force the respective outputs low and high (see table in FIG. 4).

In order to facilitate this operation of diagnostic 32, input 109 is commonly connected to the gate of transistor 106, a first terminal of resistor 107, and a cathode of diode 108. A second terminal of resistor 107 is commonly connected to a first terminal of resistor 105, a first terminal of resistor 103, and a source of transistor 101. A drain of transistor 101 is connected to bias output 111. A gate of transistor 101 is commonly connected to a first terminal of capacitor 102, a second terminal of resistor 103, and a drain of transistor 104. A gate of transistor 104 is commonly connected to output 110, to a first input of a gate 78, a first input of a gate 73, a second terminal of resistor 105, and a drain of transistor 106. A source of transistor 106 is commonly connected to an anode of diode 108, a source of transistor 104, a second terminal of capacitor 102, and input 87. Input 87 is commonly connected to the source of transistor 29, the internal ground of diagnostic 32, a first terminal of resistor 55, and the non-inverting input of amplifier 58. The second terminal of resistor 55 is commonly connected to the source of transistor 31, input 89, and a first terminal of resistor 56. A second terminal of resistor 56 is commonly connected to the inverting input of amplifier 58 and a first terminal of resistor 57. A second terminal of resistor 57 is commonly connected to the output of amplifier 58, node 59, and a non-inverting input of comparator 65. The output of comparator 65 is connected to input 84 of circuit 70. The inverting input of comparator 61 is connected to output 46 of reference 44. The output of comparator 61 is connected to input 83 of logic circuit 70. An inverting input of comparator 65 is connected to the output of amplifier 39, the non-inverting input of comparator 61, and a first terminal of resistor 40. A second terminal of resistor 40 is commonly connected to the inverting input of amplifier 39 and a first terminal of resistor 34. The non-inverting input of amplifier 39 is connected to input 87. The second terminal of resistor 34 is commonly connected to a first terminal of resistor 33, the non-inverting input of amplifier 38, and an anode of diode 37. A second terminal of resistor 33 is connected to the input 94 and the drain of transistor 29. A cathode of diode 37 is commonly connected to input 87 and a first terminal of resistor 35. A second terminal of resistor 35 is commonly connected to the inverting input of amplifier 38 and a first terminal of resistor 36. A second terminal of resistor 36 is connected to the output of amplifier 38 and the non-inverting input of comparator 41. An inverting input of comparator 41 is connected to output 45 of reference 44. The output of comparator 41 is commonly connected to input 82 of circuit 70, the enable input of amplifier 50, output 93, and the enable input of driver 28. Input 88 is connected to a first terminal of resistor 51 and the inverting input of amplifier 50. The second terminal of resistor 51 is connected to input 87. The non-inverting input of amplifier 50 is connected to output 45 of reference 44. The output of amplifier 50 is connected to output 92 and the non-inverting input of comparator 49. The inverting input of comparator 49 is connected to output 47 of reference 44. The output of comparator 49 is connected to input 81 of circuit 70. Input 81 of circuit 70 is connected to a first input of gate 75 and a first input of gate 77. Input 82 is commonly connected to a first input of inverter 72, a first input of gate 76, and a second input of gate 77. An output of inverter 72 is connected to a second input of gate 75 and a first input of gate 74. Input 83 is commonly connected to a second input of gate 74 and a first input of inverter 71. An output of inverter 71 is connected to a second input of gate 76. Input 84 is commonly connected to a third input of gate 74 and a third input of gate 76. The output of gate 74 is connected to a first input of gate 80. The output of gate 75 is connected to a second input of gate 80 and a first input of gate 79. The output of gate 76 is connected to a second input of gate 79. The output of gate 77 is connected to a third input of gate 79. The output of gate 79 is connected to a second input of gate 78 which has an output connected to output 85. The output of gate 80 is connected to a second input of gate 73 which has an output connected to the output 86.

In one embodiment, controller 16 is formed on a semiconductor substrate as an integrated circuit with diagnostic 32 and transistor 29 on the semiconductor substrate.

FIG. 5 schematically illustrates an enlarged plan view of a portion of an embodiment of a semiconductor device or integrated circuit 120 that is formed on a semiconductor die 121. Controller 16 including transistor 29 and diagnostic 32 are formed on die 121. Die 121 may also include other circuits that are not shown in FIG. 5 for simplicity of the drawing. In some embodiments, transistor 29 may be omitted from die 121 and from integrated circuit 120. Controller 16 and integrated circuit 120 are formed on die 121 by semiconductor manufacturing techniques that are well known to those skilled in the art.

In view of all of the above, it is evident that a novel device and method is disclosed. Included, among other features, is configuring a transistor test circuit to test the on-resistance of a transistor while power is applied to the drain and source of the transistor. Also included is configuring the transistor test circuit to use a drain-to-source voltage and a drain current of the transistor to determine if the on-resistance is greater than a second value. Testing the on-resistance while the transistor is powered by an external power source, facilitates testing the on-resistance of the transistor without removing the transistor from an operating circuit thereby lowering the cost of the system.

While the subject matter of the invention is described with specific preferred embodiments, it is evident that many alternatives and variations will be apparent to those skilled in the semiconductor arts. For example, transistor 29 is illustrated with two sense transistors, although only one may be used in some embodiments. Also the output of amplifier 58 may be compared to a reference voltage to determine the shorted state of transistor 29. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming a diagnostic circuit comprising:
configuring the diagnostic circuit to test an on-resistance of a transistor while power is applied to a drain and a source of the transistor from a power source that is external to the diagnostic circuit including configuring the diagnostic circuit to form a first signal that is representative of a drain-to-source voltage of the transistor, to form a second signal that is representative of a drain current of the transistor, and to use the first signal and the second signal to determine if the on-resistance is less than a first value; and
forming the diagnostic circuit and the transistor on a common semiconductor die.

2. The method of claim 1 wherein configuring the diagnostic circuit to test the on-resistance of the transistor includes configuring the diagnostic circuit to determine a forward biased condition of the transistor and responsively test the on-resistance of the transistor responsively to the forward biased condition.

3. The method of claim 2 wherein configuring the diagnostic circuit to determine the forward biased condition includes configuring the diagnostic circuit to form a first signal that is representative of a drain-to-source voltage of the transistor and to compare the first signal to a reference signal.

4. The method of claim 1 wherein configuring the diagnostic circuit to form the first signal that is representative of the drain-to-source voltage of the transistor includes configuring the diagnostic circuit to compare the first signal to the second signal and assert a third signal responsively to the second signal being greater than the first signal.

5. The method of claim 1 further including coupling the diagnostic circuit to compare the first signal to the second signal to determine an open state of the transistor.

6. The method of claim 1 further including configuring the diagnostic circuit to determine a reverse biased state of the transistor and responsively form a control signal indicating the reversed biased state.

7. The method of claim 1 further including configuring the diagnostic circuit to determine a shorted state of the transistor and responsively form a control signal state indicating the shorted state.

8. A method of forming a diagnostic circuit comprising:
configuring the diagnostic circuit to test an on-resistance of a transistor while power is applied to a drain and a source of the transistor from a power source that is external to the diagnostic circuit including configuring the diagnostic circuit to form a first signal that is representative of a drain-to-source voltage of the transistor, to form a second signal that is representative of a drain current of the transistor, and to use the first signal and the second signal to determine if the on-resistance is less than a first value; and
configuring the diagnostic circuit to compare the first signal to the second signal and assert a third signal responsively to the second signal being greater than the first signal.

\* \* \* \* \*